United States Patent

Matsuda

(10) Patent No.: US 9,310,575 B2
(45) Date of Patent: Apr. 12, 2016

(54) MANUFACTURING METHOD OF OPTO-ELECTRIC HYBRID FLEXIBLE PRINTED CIRCUIT BOARD AND OPTO-ELECTRIC HYBRID FLEXIBLE PRINTED CIRCUIT BOARD

(71) Applicant: Nippon Mektron, Ltd., Tokyo-To (JP)

(72) Inventor: Fumihiko Matsuda, Ryugasaki (JP)

(73) Assignee: NIPPON MEKTRON, LTD., Tokyo (JP)

(*) Notice: Subject to any disclaimer, the term of this patent is extended or adjusted under 35 U.S.C. 154(b) by 0 days.

(21) Appl. No.: 14/404,679

(22) PCT Filed: Dec. 25, 2012

(86) PCT No.: PCT/JP2012/083500
§ 371 (c)(1),
(2) Date: Dec. 1, 2014

(87) PCT Pub. No.: WO2013/179522
PCT Pub. Date: Dec. 5, 2013

(65) Prior Publication Data
US 2015/0147022 A1 May 28, 2015

(30) Foreign Application Priority Data
May 31, 2012 (JP) ................................. 2012-124610

(51) Int. Cl.
*G02B 6/12* (2006.01)
*G02B 6/42* (2006.01)
(Continued)

(52) U.S. Cl.
CPC .............. *G02B 6/4293* (2013.01); *B32B 37/06* (2013.01); *B32B 37/18* (2013.01); *G02B 6/4206* (2013.01);
(Continued)

(58) Field of Classification Search
CPC .. G02B 6/4293; G02B 6/4206; G02B 6/4214; G02B 6/428; G02B 6/43; B32B 37/06; B32B 37/18; H01L 31/02327; H01L 31/173; H01S 5/005; H01S 5/02248; H01S 5/02256; H01S 5/183; Y10T 156/10
USPC .......................... 385/14–15, 31–32, 129–132
See application file for complete search history.

(56) References Cited

U.S. PATENT DOCUMENTS 6,810,160 B2* 10/2004 Sugama ............. G02B 6/12002
385/129

(Continued)

FOREIGN PATENT DOCUMENTS

JP 2001-004870 A 1/2001
JP 2001-108853 A 4/2001
(Continued)

*Primary Examiner* — Ryan Lepisto
*Assistant Examiner* — Guy Anderson
(74) *Attorney, Agent, or Firm* — Jacobson Holman, PLLC.

(57) ABSTRACT

[Problem to be Solved]
To make the strength of bonding between an optical semiconductor element and a flexible printed circuit board compatible with the precision of the mounting position of the optical semiconductor element.
[Solution]
A manufacturing method according to one aspect of the present invention includes: forming a core 3b such that a width of one end thereof is larger than that of a light-emitting part 4a of a surface light-emitting element 4 and that a width of the other end thereof is smaller than that of a light-receiving part 5a of a surface light-receiving element 5 by patterning a core layer after pasting a cladding layer 3a with the core layer; producing a flexible optical waveguide 3 by pasting a cladding layer 3c having flexibility with the cladding layer 3a to cover the core 3b; pasting the flexible optical waveguide 3 at a predetermined position on a lower face of a flexible printed circuit board 2 via an adhesive sheet 6; and respectively forming, at the one end and the other end of the core 3b, optical path converting mirrors 7 and 8 each of which converts an optical path of signal light due to light reflection on an end face by processing the flexible optical waveguide 3.

18 Claims, 11 Drawing Sheets

(51) Int. Cl.
*H01L 31/0232* (2014.01)
*H01L 31/173* (2006.01)
*B32B 37/06* (2006.01)
*B32B 37/18* (2006.01)
*G02B 6/43* (2006.01)
*H01S 5/00* (2006.01)
*H01S 5/022* (2006.01)
*H01S 5/183* (2006.01)

(52) U.S. Cl.
CPC .............. *G02B 6/428* (2013.01); *G02B 6/4214* (2013.01); *G02B 6/43* (2013.01); *H01L 31/02327* (2013.01); *H01L 31/173* (2013.01); *H01S 5/005* (2013.01); *H01S 5/02248* (2013.01); *H01S 5/02256* (2013.01); *H01S 5/183* (2013.01); *Y10T 156/10* (2015.01)

(56) References Cited

U.S. PATENT DOCUMENTS

| | | | | |
|---|---|---|---|---|
| 7,366,375 B2 * | 4/2008 | Ohtorii | | G02B 6/43 385/129 |
| 7,529,439 B2 * | 5/2009 | Kim | | G02B 6/4214 385/14 |
| 7,995,881 B2 * | 8/2011 | Hodono | | G02B 6/4214 385/14 |
| 8,369,675 B2 * | 2/2013 | Yanagisawa | | G02B 6/138 385/129 |
| 8,437,584 B2 * | 5/2013 | Matsuoka | | G02B 6/43 385/14 |
| 8,588,558 B2 * | 11/2013 | Vernooy | | G02B 6/138 385/14 |
| 2010/0142881 A1 * | 6/2010 | Vernooy | | G02B 6/138 385/14 |
| 2010/0316335 A1 * | 12/2010 | Furuyama | | G02B 6/1221 385/88 |
| 2011/0188816 A1 * | 8/2011 | Uemura | | G02B 6/36 385/88 |
| 2012/0045168 A1 * | 2/2012 | Uemura | | G02B 6/1221 385/14 |
| 2014/0064668 A1 * | 3/2014 | Nishikawa | | G02B 6/43 385/77 |

FOREIGN PATENT DOCUMENTS

| | | |
|---|---|---|
| JP | 2005-201937 A | 7/2005 |
| JP | 2005-284302 A | 10/2005 |
| JP | 2007-004043 A | 1/2007 |
| JP | 2007-293308 A | 11/2007 |
| JP | 2008-261956 A | 10/2008 |
| JP | 2009-058923 A | 3/2009 |
| JP | 2009-288341 A | 12/2009 |
| JP | 2010-054617 A | 3/2010 |
| JP | 2010-286777 A | 12/2010 |
| JP | 2011-221195 A | 11/2011 |
| JP | 2012/026435 A1 | 3/2012 |
| JP | 2012-098465 A | 5/2012 |
| WO | 2008/053888 A1 | 5/2008 |
| WO | 2012/043609 A1 | 4/2012 |

* cited by examiner

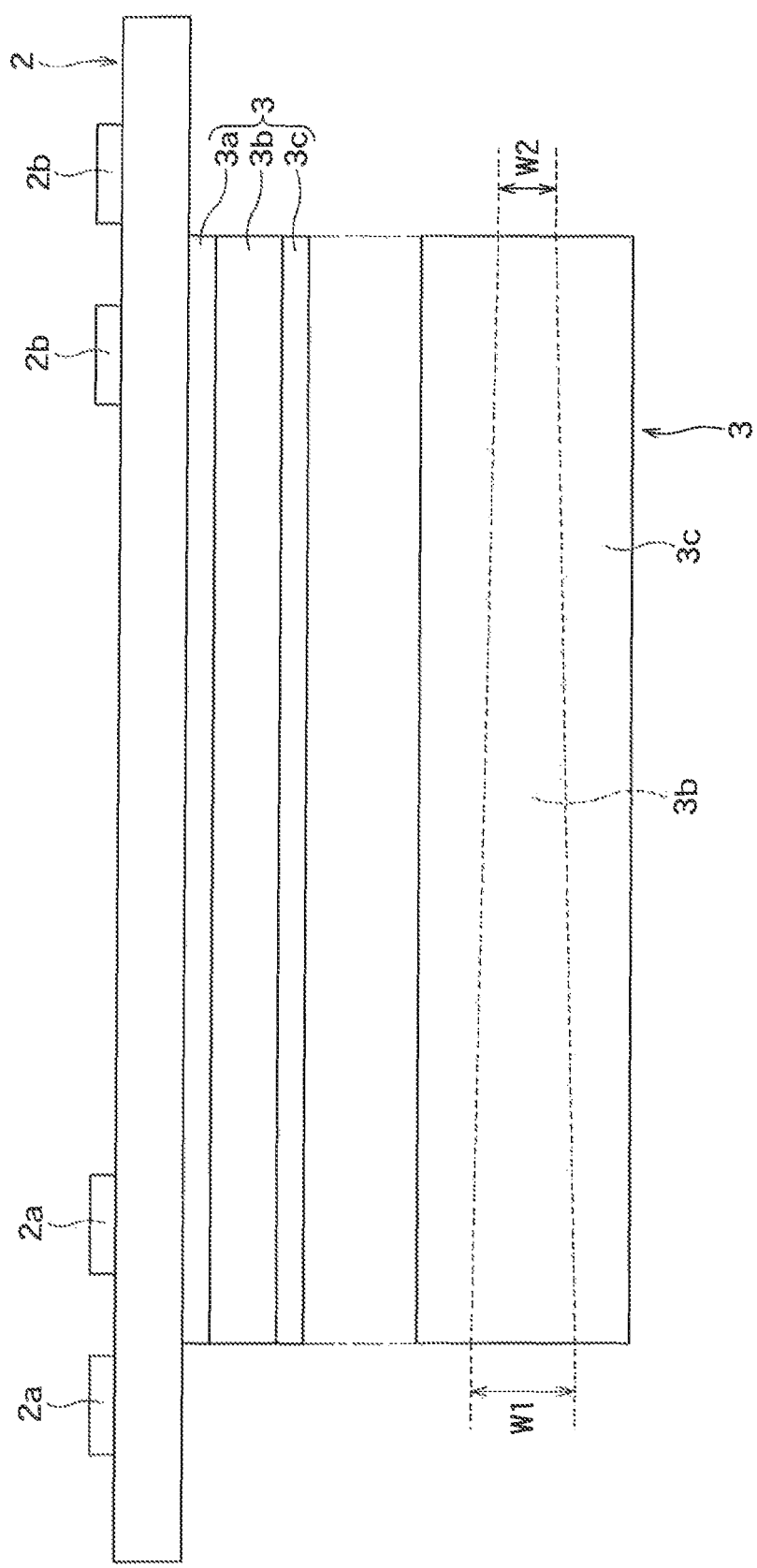
F I G. 2B

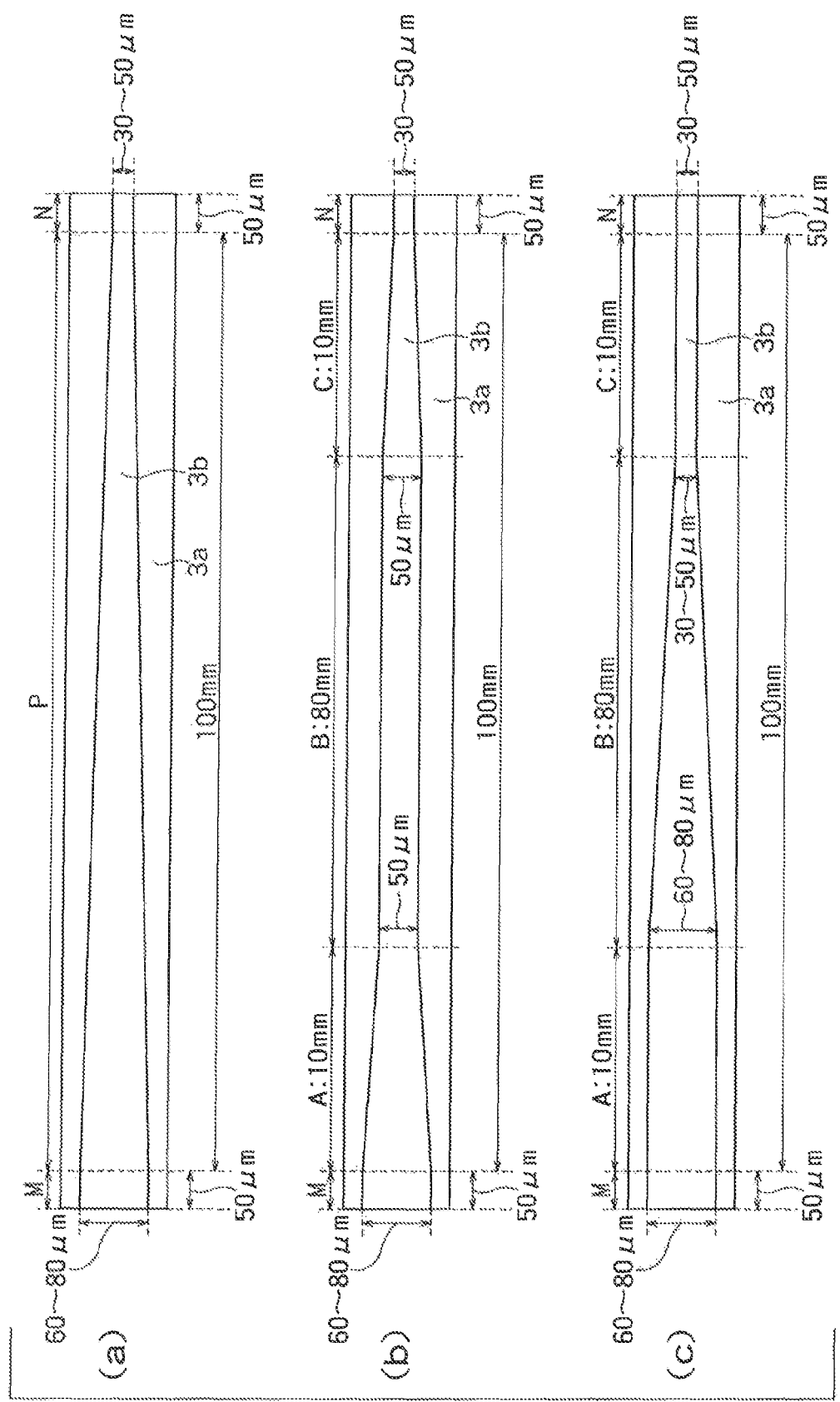
F I G. 3

(a)

| CORE WIDTH (μm) | | POWER (mW) | POWER DECREASE RATE |
|---|---|---|---|
| INCIDENT SIDE | EXITING SIDE | | |
| 80 | 30 | 1.35 | 4.3% |
| 70 | 30 | 1.36 | 3.5% |
| 60 | 30 | 1.37 | 2.8% |
| 50 | 50 | 1.41 | 0.0% |

(b)

| CORE WIDTH (μm) | REGION A | | REGION B | | REGION C | | POWER (mW) | POWER DECREASE RATE |
|---|---|---|---|---|---|---|---|---|
| | INCIDENT SIDE | EXITING SIDE | INCIDENT SIDE | EXITING SIDE | INCIDENT SIDE | EXITING SIDE | | |
| 80 | 80 | 50 | 50 | 50 | 50 | 30 | 1.35 | 4.3% |
| 70 | 70 | 50 | 50 | 50 | 50 | 30 | 1.36 | 3.5% |
| 60 | 60 | 50 | 50 | 50 | 50 | 30 | 1.37 | 2.8% |
| 50 | 50 | 50 | 50 | 50 | 50 | 50 | 1.41 | 0.0% |

(c)

| CORE WIDTH (μm) | REGION A | | REGION B | | REGION C | | POWER (mW) | POWER DECREASE RATE |
|---|---|---|---|---|---|---|---|---|
| | INCIDENT SIDE | EXITING SIDE | INCIDENT SIDE | EXITING SIDE | INCIDENT SIDE | EXITING SIDE | | |
| 80 | 80 | 70 | 30 | 30 | 30 | 30 | 1.35 | 4.3% |
| 70 | 70 | 60 | 30 | 30 | 30 | 30 | 1.36 | 3.5% |
| 60 | 60 | 50 | 30 | 30 | 30 | 30 | 1.37 | 2.8% |
| 50 | 50 | 50 | 50 | 50 | 50 | 50 | 1.41 | 0.0% |

FIG. 4

MANUFACTURING METHOD OF OPTO-ELECTRIC HYBRID FLEXIBLE PRINTED CIRCUIT BOARD AND OPTO-ELECTRIC HYBRID FLEXIBLE PRINTED CIRCUIT BOARD

This is a national stage of PCT/JP2012/083500 filed Dec. 25, 2012 and published in Japanese, which has a priority of Japanese no. 2012-124610 filed May 31, 2012, hereby incorporated by reference.

TECHNICAL FIELD

The present invention relates to a manufacturing method of an opto-electric hybrid flexible printed circuit board, more specifically relates to a manufacturing method of an opto-electric hybrid flexible printed circuit board including a flexible printed circuit board and a flexible optical waveguide provided on the flexible printed circuit board, and also relates to an opto-electric hybrid flexible printed circuit board.

BACKGROUND ART

Small-sized and high-functionality electronic devices are exceedingly prevailing in recent years. According to this, flexible printed circuit boards are widely used primarily for the small-sized electronic devices such as a notebook-type personal computer, a digital camera, a mobile phone and a game machine.

Information amount handled by the electronic device as above tends to increase in particular and the signal transmission speed of such an electronic device is higher, accordingly. For example, in a case of personal computers, the transmission speed is moving to the standard of 6 Gbps from 2010 to 2011. Importance of taking a signal loss in the transmission line into consideration is increasing.

In addition, the signal amplitude voltage of a signal source tends to be low for transmitting a pulse signal therefrom at high speed in recent years. Owing to this, there becomes a situation in which spike noise derived from the outside or caused by the signal source itself is liable to disturb accurate signal transmission. Typically, a circuit board for performing high-speed signal transmission has transmission lines which have undergone impedance matching. Even with such a circuit board, however, signal loss in the transmission line is increasingly considerable.

Against the spike noise as above, noise control needs to be taken in the transmission lines and/or the electronic device. Specifically, an electromagnetic shield has to be provided for the transmission lines. Nevertheless, to provide the electromagnetic shield, in turn, increases the thickness of the transmission lines. Owing to this, there is a case, for example, where it is difficult to secure the flexibility of the hinge connecting the display to the keyboard of a notebook-type personal computer.

Therefore, to solve the problems of the transmission loss and noise tolerance in high-speed transmission of electric signals, the possible application of the high-speed signal transmission technique that uses an optical fiber and is used in practical applications for long-range signal transmission to the above-mentioned small-sized electronic devices is discussed.

Furthermore, opto-electric hybrid flexible printed circuit boards are known which are obtained by combining a flexible polymer optical waveguide made of organic polymer with a flexible printed circuit board (hereinafter, also briefly "FPC") in order to apply the high-speed signal transmission technique using light to the hinge of a notebook-type personal computer or the like (for example, refer to Patent Literature 1 to Patent Literature 3).

CITATION LIST

Patent Literature

Patent Literature 1: Japanese Patent Laid-Open No. 2010-054617
Patent Literature 2: Japanese Patent Laid-Open No. 2009-58923
Patent Literature 3: Japanese Patent Laid-Open No. 2010-286777

SUMMARY OF INVENTION

Technical Problem

A planar optical semiconductor element (a surface light-emitting element or a surface light-receiving element) is implemented on an FPC of an opto-electric hybrid flexible printed circuit board such that communication can be performed through a flexible optical waveguide. A mounting position of the optical semiconductor element has to tolerate strict conditions. Owing to this, even if a heating temperature in reflowing is not more than the heat resistant temperature of the optical semiconductor element (for example, 300° C.), the implementation of the optical semiconductor element is typically performed not by reflowing but by ultrasonic bonding (gold-gold ultrasonic bonding or the like). The reason is that, in a case of reflowing, the precision of the mounting position (for example, not more than ±10 μm) is difficult to satisfy since the optical semiconductor element placed on the FPC moves from the predetermined position as solder paste is molten.

Meanwhile, in a case of ultrasonic bonding, ultrasonic waves which travel in the planar direction of the FPC are applied in a state where appropriate pressure is being exerted in the thickness direction of the FPC. Atomic diffusion induced by the ultrasonic waves allows the electrodes of the optical semiconductor element and the pads of the FPC to be electrically connected. Hence, the position displacement of the optical semiconductor element in the implementing process in the case of ultrasonic bonding is expected to be smaller than that in the case of reflowing.

In reality, however, in the case of using the ultrasonic bonding for the opto-electric hybrid flexible printed circuit board, the following new problems arise.

The flexible optical waveguide of the opto-electric hybrid flexible printed circuit board is composed of a material low in elastic modulus such as organic polymer. Owing to this, it is difficult for the pressure and the ultrasonic waves applied in performing the ultrasonic bonding to effectively act on the opto-electric hybrid flexible printed circuit board. Namely, an increase of the pressure in the thickness direction just causes the deformation of the flexible optical waveguide accordingly. As a result, a sufficient pressure is not applied to a portion in which the optical semiconductor element contacts the FPC. Therefore, it is disadvantageously impossible to ensure sufficient strength of bonding the optical semiconductor element to the FPC.

To solve the problem, it may be considered that the output of the ultrasonic waves is configured to be high for securing sufficient bonding strength. If the output of the ultrasonic waves is made high, however, the amplitude of the ultrasonic waves also becomes large, resulting in the deterioration in the precision of the mounting position of the optical semiconductor element. Displacement in mounting position is anticipated to cause part of signal light not to be used for irradiation of the optical path converting mirror. In such a case, the light power of the signal light received by the surface light-receiving element greatly decreases. As such, the bonding strength and the precision of the mounting position are in the relationship of trade-off and to increase the bonding strength disadvantageously causes the deterioration in the precision of the mounting position.

As described above, it is conventionally difficult to make the bonding strength compatible with the precision of the position, which is a main cause for the decrease in the yield of opto-electric hybrid flexible printed circuit boards.

The present invention is made on the basis of the above-mentioned technical recognition, and an object of the present invention is to make the strength of bonding between an optical semiconductor element and a flexible printed circuit board compatible with the precision of the mounting position of the optical semiconductor element, and to improve the yield of opto-electric hybrid flexible printed circuit boards.

Solution to Problem

There is provided a manufacturing method of an opto-electric hybrid flexible printed circuit board according to one aspect of the present invention, the opto-electric hybrid flexible printed circuit board including a flexible printed circuit board having a first principal surface and a second principal surface on an opposite side to the first principal surface; a flexible optical waveguide provided along the first principal surface of the flexible printed circuit board; and a surface light-emitting element and a surface light-receiving element both of which are implemented on the second principal surface of the flexible printed circuit board, the method including: forming a core such that a width of one end thereof is larger than that of a light-emitting part of the surface light-emitting element and that a width of another end thereof is smaller than that of a light-receiving part of the surface light-receiving element by patterning a core layer having flexibility after pasting a first cladding layer having flexibility with the core layer; producing the flexible optical waveguide by pasting a second cladding layer having flexibility with the first cladding layer so as to cover the core; pasting the flexible optical waveguide at a predetermined position on the first principal surface of the flexible printed circuit board via an adhesive sheet; and respectively forming, at the one end and the other end of the core, a first optical path converting mirror and a second optical path converting mirror each of which converts an optical path of signal light due to light reflection on an end face by processing the flexible optical waveguide pasted with the flexible printed circuit board.

Moreover, there is provided a manufacturing method of an opto-electric hybrid flexible printed circuit board according to another aspect of the present invention, the opto-electric hybrid flexible printed circuit board including a flexible printed circuit board having a first principal surface and a second principal surface on an opposite side to the first principal surface; a flexible optical waveguide provided along the first principal surface of the flexible printed circuit board; and a surface light-emitting element and a surface light-receiving element both of which are implemented on the second principal surface of the flexible printed circuit board, the method including: pasting a first cladding layer having flexibility and adhesion at a predetermined position on the first principal surface of the flexible printed circuit board; pasting a core layer having flexibility with the first cladding layer on the flexible printed circuit board; forming a core such that a width of one end thereof is larger than that of a light-emitting part of the surface light-emitting element and that a width of another end thereof is smaller than that of a light-receiving part of the surface light-receiving element by patterning the core layer; producing the flexible optical waveguide by pasting a second cladding layer having flexibility with the first cladding layer so as to cover the core; and respectively forming, at the one end and the other end of the core, a first optical path converting mirror and a second optical path converting mirror each of which converts an optical path of signal light due to light reflection on an end face by processing the flexible optical waveguide.

There is provided an opto-electric hybrid flexible printed circuit board according to one aspect of the present invention, the board including: a flexible printed circuit board that has a first principal surface and a second principal surface on an opposite side to the first principal surface, and that is provided with first and second pads on the second principal surface; a flexible optical waveguide that has a core and a cladding which covers an outer circumference of the core, and that is provided along the first principal surface of the flexible printed circuit board, first and second optical path converting mirrors each of which converts an optical path of signal light due to light reflection on an end face being provided at one end and the other end of the flexible optical waveguide, respectively; a surface light-emitting element that has a light-emitting part emitting the signal light and a first electrode provided on the same face as that of the light-emitting part, and that is implemented on the second principal surface of the flexible printed circuit board such that the signal light emitted from the light-emitting part is reflected by the first optical path converting mirror and propagates in the core of the flexible optical waveguide; and a surface light-receiving element that has a light-receiving part receiving the signal light and a second electrode provided on the same face as that of the light-receiving part, and that is implemented on the second principal surface of the flexible printed circuit board such that the signal light reflected by the second optical path converting mirror is incident on the light-receiving part, wherein a width of the one end of the core is larger than that of the light-emitting part and a width of the other end of the core is smaller than that of the light-receiving part, the first electrode of the surface light-emitting element is electrically connected to the first pad of the flexible printed circuit board using ultrasonic bonding, and the second electrode of the surface light-receiving element is electrically connected to the second pad of the flexible printed circuit board with the ultrasonic bonding.

Advantageous Effects of Invention

According to the present invention, the core in which the width of the one end thereof is larger than the light-emitting part of the surface light-emitting element and the width of the other end thereof is smaller than the light-receiving part of the surface light-receiving element is formed. Thereby, a margin (tolerance amount) of the surface light-emitting element and the surface light-receiving element with respect to displacement in mounting position of the core in the width direction can be increased. Thus, even when the output of ultrasonic waves is configured to be high for securing the strength of bonding, a decrease rate of signal light power can be suppressed to be low.

According to the present invention, it is possible to make the strength of bonding between an optical semiconductor element and a flexible printed circuit board compatible with the precision of the mounting position of the optical semiconductor element.

BRIEF DESCRIPTION OF DRAWINGS

FIG. 2B is an explanatory diagram for a manufacturing method of the opto-electric hybrid flexible printed circuit board according to the second embodiment of the present invention succeedingly to FIG. 2A.

FIG. 3 illustrates plan views of examples of a core shape of a flexible optical waveguide.

FIG. 4 illustrates decrease rates of signal light power as results obtained by simulation.

DESCRIPTION OF EMBODIMENTS

Figure 1A:
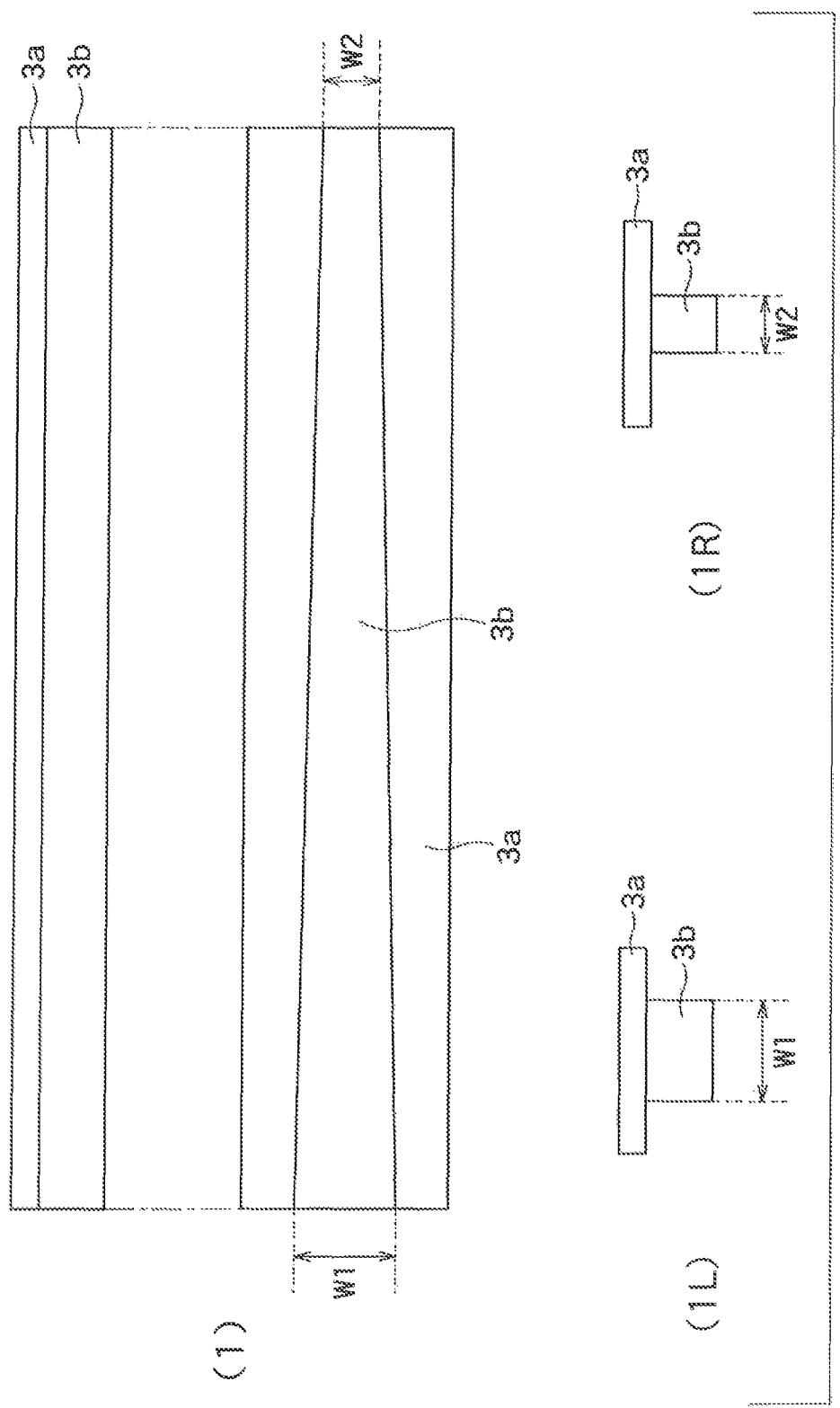
FIG. 1A is an explanatory diagram for a manufacturing method of the opto-electric hybrid flexible printed circuit board according to the first embodiment of the present invention.

Hereafter, embodiments of the present invention will be described with reference to the drawings. The same signs are given to the constituents that have equivalent functions in the drawings and the detailed description of the constituents with the same signs is omitted. Moreover, the drawings are schematic, and the relations between thicknesses and planar dimensions, the ratios between thicknesses of layers and the like are not the reality. Moreover, the numerical values in the description of the embodiments are exemplary values and the present invention is not limited by the values.

First Embodiment

First, a schematic configuration of an opto-electric hybrid flexible printed circuit board according to a first embodiment is described.

Figure 1B:
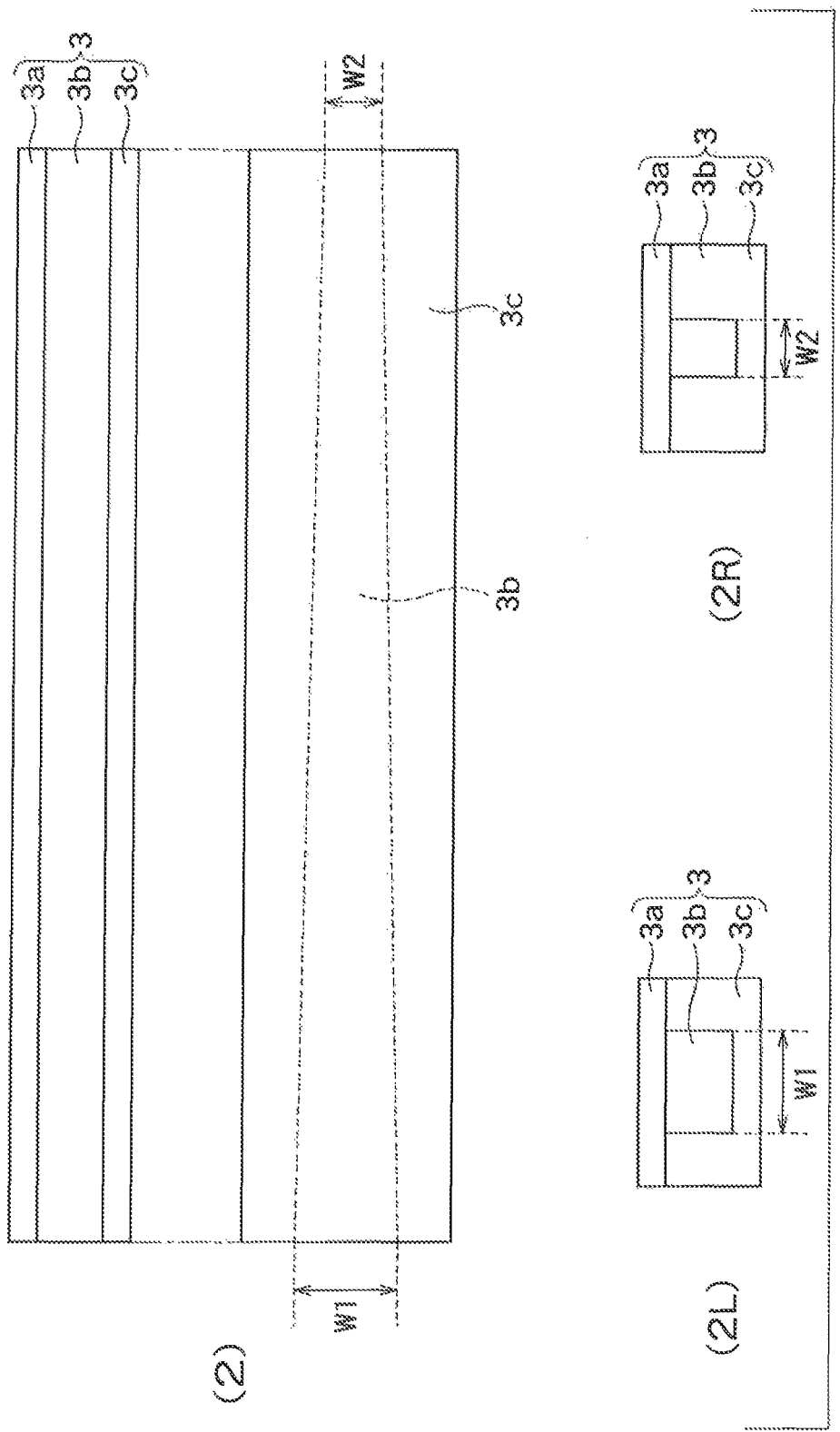
FIG. 1B is an explanatory diagram for a manufacturing method of the opto-electric hybrid flexible printed circuit board according to the first embodiment of the present invention succeedingly to FIG. 1A.
Figure 1C:
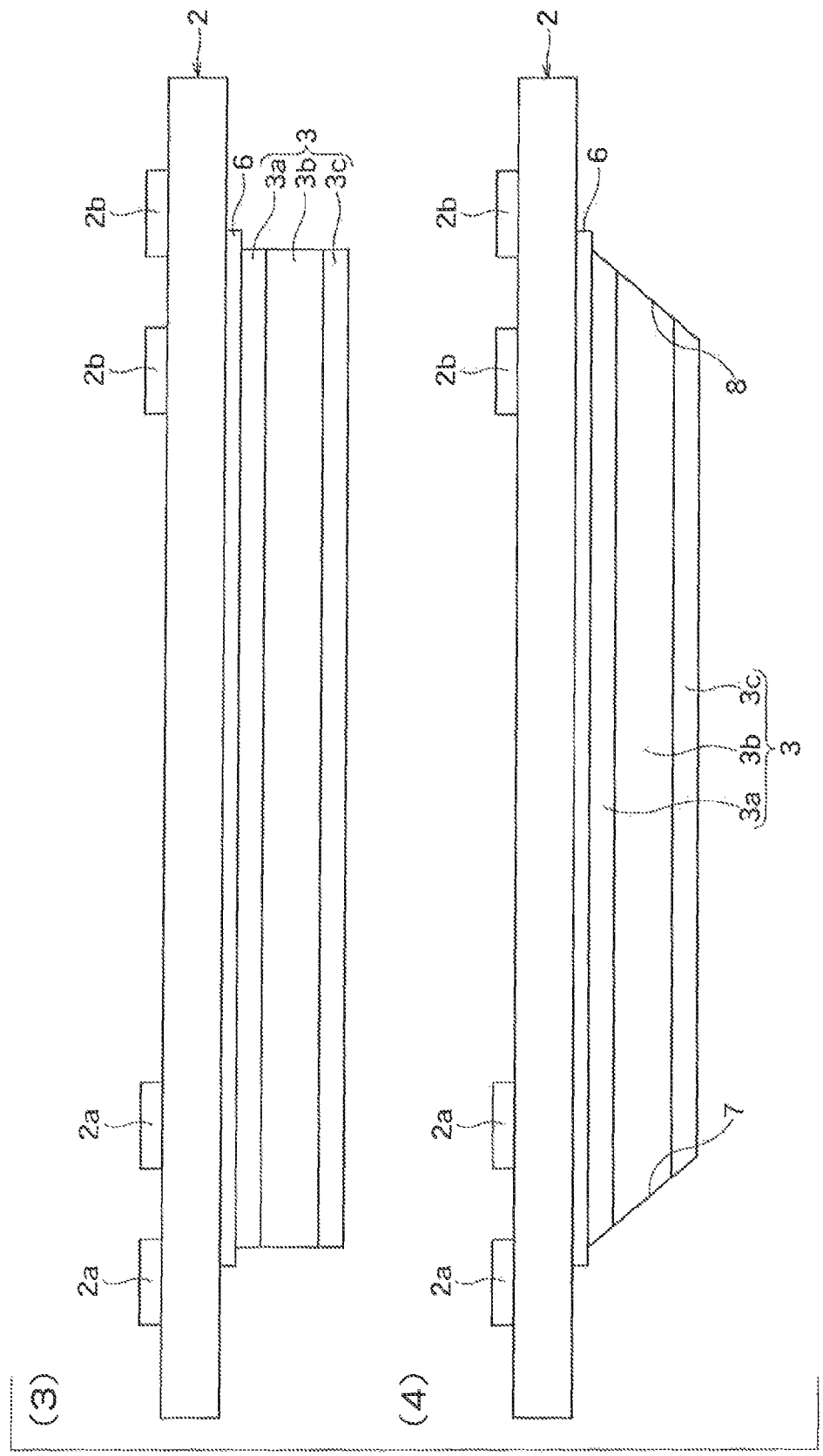
FIG. 1C is an explanatory diagram for a manufacturing method of the opto-electric hybrid flexible printed circuit board according to the first embodiment of the present invention succeedingly to FIG. 1B.
Figure 1D:
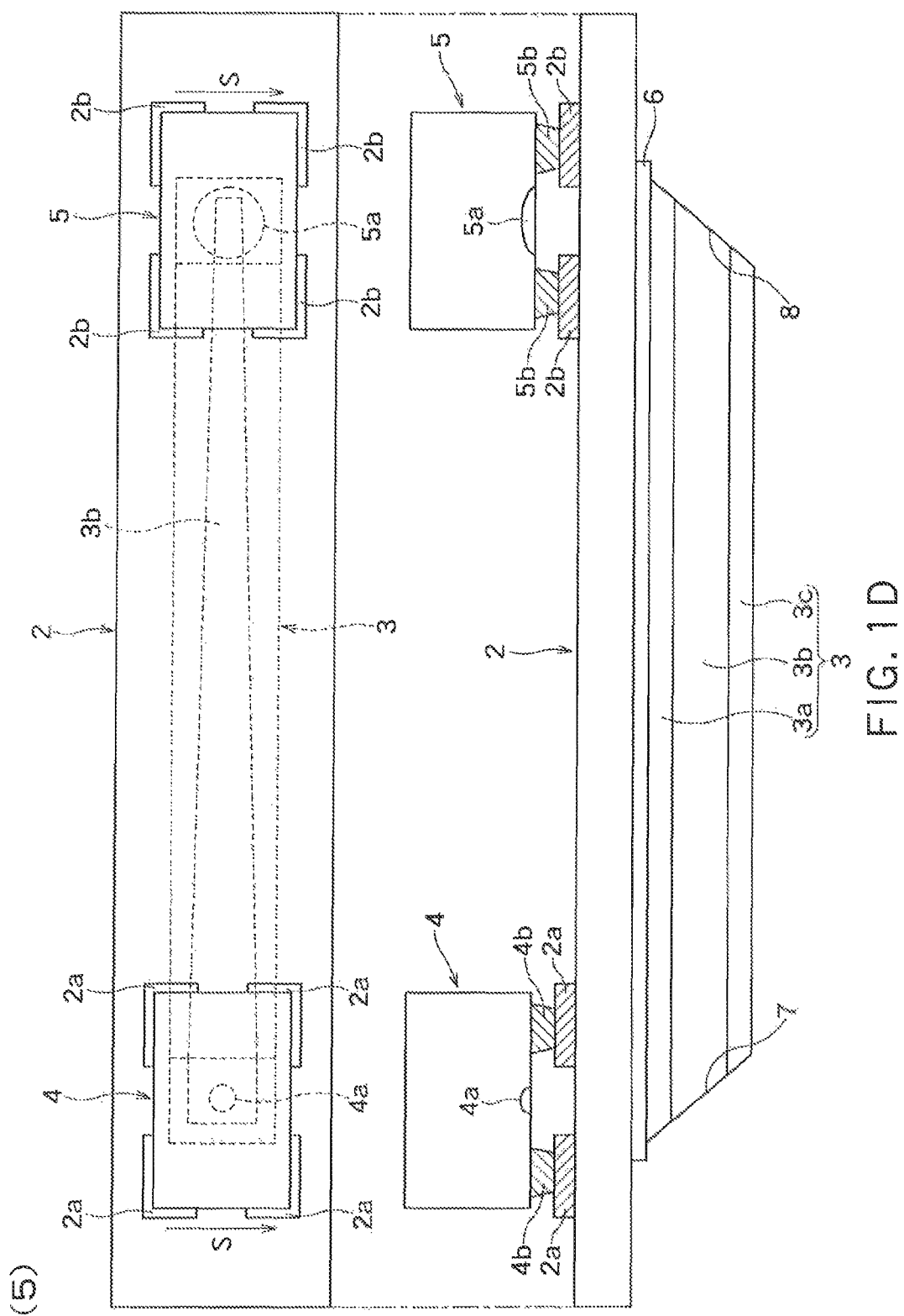
FIG. 1D is an explanatory diagram for a manufacturing method of the opto-electric hybrid flexible printed circuit board according to the first embodiment of the present invention succeedingly to FIG. 1C.
Figure 1E:
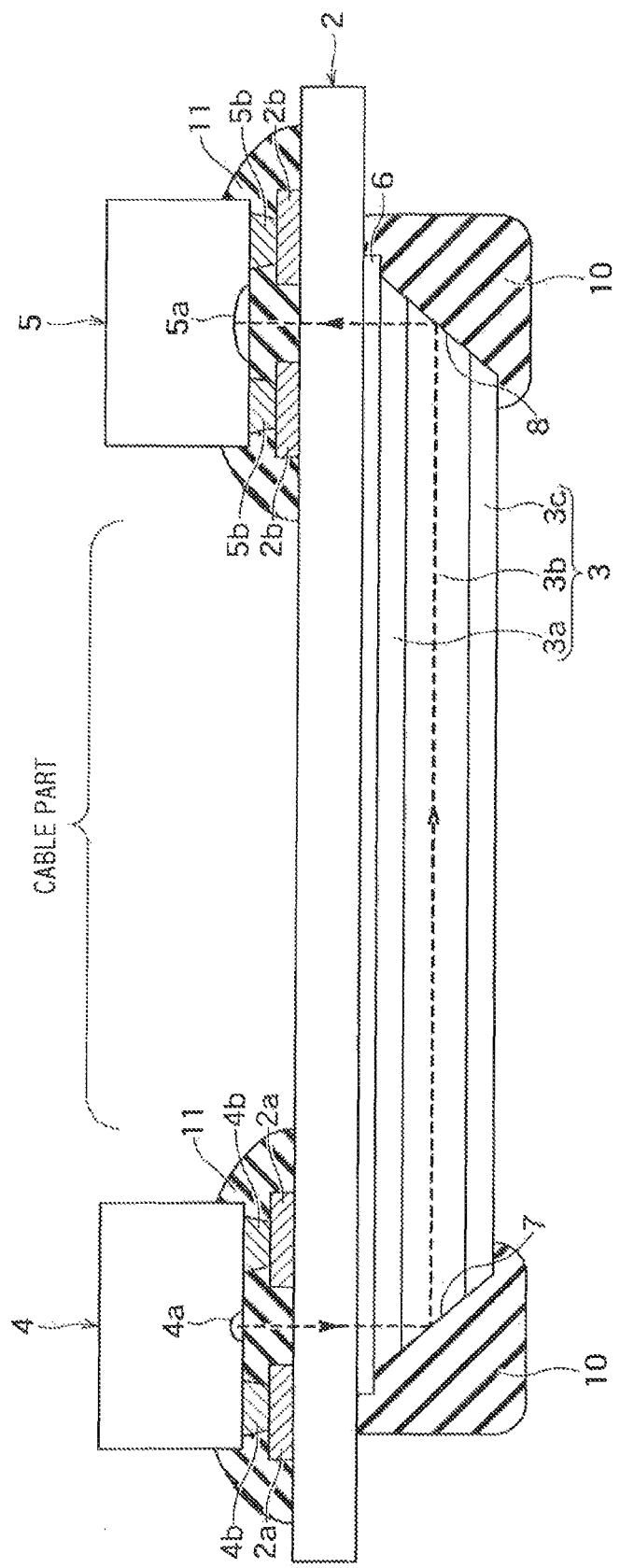
FIG. 1E is a cross-sectional view illustrating a schematic configuration of the opto-electric hybrid flexible printed circuit board according to the first embodiment of the present invention.

FIG. 1E illustrates a cross-sectional view of an opto-electric hybrid flexible printed circuit board 1 according to the first embodiment. As illustrated in FIG. 1E, the opto-electric hybrid flexible printed circuit board 1 according to the present embodiment includes: a flexible printed circuit board 2 having flexibility; a flexible optical waveguide 3 having flexibility pasted on a lower face (first principal surface) of the flexible printed circuit board 2 via an adhesive sheet 6; and a surface light-emitting element 4 and a surface light-receiving element 5 which are implemented on an upper face (second principal surface) of the flexible printed circuit board 2. Notably, in the following description, there is a case where the surface light-emitting element 4 and the surface light-receiving element 5 are referred to as optical semiconductor elements as a whole.

As illustrated in FIG. 1E, a region interposed between the surface light-emitting element 4 and the surface light-receiving element 5 is a cable part of the opto-electric hybrid flexible printed circuit board 1. The opto-electric hybrid flexible printed circuit board 1 can be bent at the cable part thereof.

The flexible printed circuit board 2 has an insulation base film such as polyimide and pads 2a for the surface light-emitting element 4 and pads 2b for the surface light-receiving element 5 are provided on the upper face (second principal surface). The pads 2a and 2b are integrally provided with a wiring pattern (not shown). The pads 2a and 2b are obtained, for example, by processing a copper foil into a predetermined shape and plating its surface with gold. Notably, not shown in the figure, target marks for positioning the flexible optical waveguide 3 to the optical semiconductor elements, and in addition to these, circuits for driving the optical semiconductor elements, circuits and wires for signal conversion, and the like are formed on the flexible printed circuit board 2.

Notably, FIG. 1E illustrates a single-layer single-sided flexible printed circuit board as the flexible printed circuit board 2, which, however, is not so limited. For example, the flexible printed circuit board 2 may be a double-sided flexible printed circuit board also on a lower face of which a wiring pattern is provided as well as on the upper face thereof or may be a multi-layer flexible printed circuit board.

The flexible optical waveguide 3 has a cladding constituted of cladding layers 3a and 3c and a core 3b processed into a predetermined shape. An outer circumference of the core 3b is surrounded by the cladding. The refractive index of the core is higher than the refractive index of the cladding. The shape of the core 3b is described in detail later.

Moreover, as illustrated in FIG. 1E, at one end and the other end of the flexible optical waveguide 3, optical path converting mirrors 7 and 8 each of which converts an optical path of signal light due to light reflection on an end face are provided, respectively. The optical path converting mirrors 7 and 8 are provided on the optical path of signal light as illustrated in FIG. 1E.

The surface light-emitting element 4 and the surface light-receiving element 5 are elements of bare chip type normally. The surface light-emitting element 4 has a light-emitting part 4a emitting signal light and electrodes 4b provided on the same face as that of the light-emitting part 4a. The electrodes 4b are electrically connected to the pads 2a using ultrasonic bonding. As the surface light-emitting element 4, a VCSEL (Vertical Cavity Surface Emitting LASER) is used, for example. The surface light-receiving element 5 has a light-receiving part 5a receiving the signal light and electrodes 5b provided on the same face as that of the light-receiving part 5a. The electrodes 5b are electrically connected to the pads 2b using ultrasonic bonding. As the surface light-receiving element 5, a photodiode having sensitivity at the wavelength of the surface light-emitting element 4 (for example, 850 nm) is used.

Notably, in an implementing process of the surface light-emitting element 4 and the surface light-receiving element 5, when gold-gold ultrasonic bonding is used as the ultrasonic bonding, the surfaces of the electrodes 4b and 5b are plated with gold.

As to the sizes of the surface light-emitting element 4 and the surface light-receiving element 5, the length of one side thereof is approximately 0.3 mm. The diameter of the light-emitting part 4a is approximately 30 μm and the diameter of the light-receiving part 5a is approximately 80 μm.

Next, using FIG. 1A to FIG. 1E, a manufacturing method of the opto-electric hybrid flexible printed circuit board according to the first embodiment is described.

First, as illustrated in portion (1) of FIG. 1A, a cladding layer 3a having flexibility is pasted with a core layer having flexibility. Thicknesses of the cladding layer 3a and the core layer are, for example, 20 μm and 50 μm, respectively. After that, the core layer undergoes patterning, and thereby, the core 3b is formed in which a width (W1) of one end thereof is larger than that of the light-emitting part 4a of the surface light-emitting element 4 and a width (W2) of the other end thereof is smaller than that of the light-receiving part 5a of the surface light-receiving element 5. The widths W1 and W2 are, for example, 80 μm and 30 μm, respectively. Notably, portions (1L) and (1R) of FIG. 1A are lateral views of the cladding layer 3a and the core 3b illustrated in portion (1) of FIG. 1A as seen from the left side and the right side, respectively.

In the process, it is preferable that the width (W1) of the one end of the core 3b is formed so as to be larger than a value obtained by adding a diameter of the signal light with which the optical path converting mirror 7 is irradiated in the width direction of the core 3b and a position displacement amount, of the surface light-emitting element 4 in the width direction, which arises in an ultrasonic bonding process mentioned later. In addition to this, it is preferable that the width (W2) of the other end of the core 3b is formed so as to be larger than a value obtained by adding a diameter of the signal light with which the optical path converting mirror 8 is irradiated in the width direction of the core 3b and a position displacement amount, of the surface light-receiving element 5 in the width direction, which arises in the ultrasonic bonding process mentioned later.

Notably, examples of the processing method of the core layer can include a photofabrication technique including an exposure process with UV light and a developing process using an alkaline solution (or organic solvent) or the like. Moreover, not limited to the above, a photobreaching technique, an imprinting technique or the like may be used. In the photobreaching technique, only exposure/heating processing of a single material enables the production of a polymer optical waveguide having a core and a cladding which are different in refractive index from each other. Since the production of a polymer optical waveguide from a single material is enabled, it has a merit in cost. Moreover, in the imprinting technique, an original mold having roughness with a pattern corresponding to the pattern of the core is used. An optical waveguide material configured of transparent core material and cladding material which are UV curing and different in refractive index from each other is brought into contact with the original mold. After that, it is irradiated with UV light to cure the core material. After that, the original mold is peeled off the cured core material, and thereby, the desired optical waveguide pattern is obtained. Any of the photobreaching technique and the imprinting technique above does not need the developing process. Moreover, the planar shape of the core 3b is not limited to a straight shape but may be a curved shape or a branched shape.

Next, as illustrated in portion (2) of FIG. 1B, a cladding layer 3c having flexibility is pasted with the cladding layer 3a so as to cover the core 3b. Then, the cladding layers 3a and 3c and the core 3b are cured with UV light, heat or the like, and thereby, the flexible optical waveguide 3 is produced. A thickness of the cladding layer 3c is, for example, 70 μm. Notably, portions (2L) and (2R) of FIG. 1B are lateral views of the flexible optical waveguide 3 illustrated in portion (2) of FIG. 1B as seen from the left side and the right side, respectively. Preferably, the flexible optical waveguide 3 is a polymer optical waveguide and any of the core 3b and the cladding layers 3a and 3c is made of organic polymer using a base resin (acrylic resin or the like) which is high in transparency and soft.

Next, as illustrated in portion (3) of FIG. 1C, the flexible optical waveguide 3 is pasted at a predetermined position on the lower face of the flexible printed circuit board 2 via the adhesive sheet 6 (sheet-like optical adhesive). After that, the adhesive sheet 6 is cured by irradiation with UV light or the like.

Notably, the adhesive sheet 6 is preferable to be less absorptive at a wavelength of the signal light emitted from the surface light-emitting element 4. When absorption of the signal light with the adhesive sheet 6 is allowable, as illustrated in portion (3) of FIG. 1C, the adhesive sheet 6 may be disposed so as to be put across the optical path of the signal light. Meanwhile, when it is not allowable, the adhesive sheet 6 in which openings are provided for averting the optical path is used.

Moreover, the adhesive sheet 6 is not necessarily provided over the whole flexible optical waveguide 3 but a layer of the adhesive sheet 6 may be provided, for example, only in an end portion of the flexible optical waveguide 3.

Notably, a thickness of the insulation base film of the flexible printed circuit board 2 is, for example, 12.5 μm, 25 μm or 50 μm. Thicknesses of the pads 2a and 2b are, for example, 12 μm.

Moreover, through holes (not shown) may be provided in regions, of the flexible printed circuit board 2, corresponding to the optical path. By doing so, even when absorption of the signal light with the insulation base film of the flexible printed circuit board 2 is large, intensity of the signal light received by the surface light-receiving element 5 can be improved.

Next, as illustrated in portion (4) of FIG. 1C, the flexible optical waveguide 3 pasted with the flexible printed circuit board 2 is processed. This forms the optical path converting mirror 7 at one end of the core 3b and the optical path converting mirror 8 at the other end of the core 3b. The optical path converting mirrors 7 and 8 are formed so as to form predetermined angles (for example, 45 degrees) with respect to the lower face of the flexible printed circuit board 2. The positions of those are determined based on the optical path of the signal light. More specifically, the optical path converting mirrors 7 and 8 are formed immediately below respective positions where the light-emitting part 4a of the surface light-emitting element 4 and the light-receiving part 5a of the surface light-receiving element 5 are to be implemented.

The formation of the optical path converting mirrors 7 and 8 is performed, for example, with a circular blade used for dicing processing. In this case, the distance between the edge of the blade and the flexible printed circuit board 2 is controlled on the order of micrometers to form an inclined surface depending on the shape of the edge of the blade. Otherwise, the optical path converting mirrors 7 and 8 may be formed using laser processing.

When the optical path converting mirrors 7 and 8 are to be protected with a sealing resin 10, the optical path converting mirrors 7 and 8 are coated with metal films (not shown) such as gold (Au) using a sputtering method or a deposition method. The sealing resin 10 may be formed succeedingly to the formation of the metal films or may be formed in the following process of forming a sealing resin 11.

Next, as illustrated in portion (5) of FIG. 1D, the surface light-emitting element 4 and the surface light-receiving element 5 are implemented on the upper face of the flexible printed circuit board 2. More in detail, the surface light-emitting element 4 and the surface light-receiving element 5 are implemented such that the optical axis matches the optical path converting mirrors by high-precision positioning using a flip-chip bonder or the like.

The surface light-emitting element 4 is implemented on the flexible printed circuit board 2 such that the signal light emitted from the light-emitting part 4a is reflected on the optical path converting mirror 7 to propagate in the core 3b. This implementation is performed using ultrasonic bonding. More in detail, while pressure in the thickness direction is being exerted on the surface light-emitting element 4 placed at a predetermined position on the flexible printed circuit board 2, an ultrasonic wave traveling in a width direction S (short-axis direction) of the core 3b is applied to the surface light-emitting element 4. By doing so, the electrodes 4b of the surface light-emitting element 4 are electrically connected to the pads 2a of the flexible printed circuit board 2.

The surface light-receiving element 5 is implemented on the flexible printed circuit board 2 such that the signal light reflected on the optical path converting mirror 8 is incident on the light-receiving part 5a of the surface light-receiving element 5. This implementation is performed using the ultrasonic bonding. More in detail, while pressure in the thickness direction is being exerted on the surface light-receiving element 5 placed at a predetermined position on the flexible printed circuit board 2, an ultrasonic wave traveling in the width direction S (short-axis direction) of the core 3b is applied to the surface light-receiving element 5. By doing so, the electrodes 5b of the surface light-receiving element 5 are electrically connected to the pads 2b of the flexible printed circuit board 2.

Notably, the application direction S of the ultrasonic wave is not limited to the downward direction in FIG. 1D but may be the upward direction. Moreover, in order to prevent heat from being applied to the optical semiconductor elements due to the reflow process, it is preferable that, before the optical semiconductor elements are implemented, electronic components such as controlling ICs for the optical semiconductor elements and passive elements are implemented on the flexible printed circuit board 2.

Next, as illustrated in FIG. 1E, the surface light-emitting element 4 and the surface light-receiving element 5 are fixed with the sealing resin 11 high in transparency (that is, less absorptive to the signal light). The sealing resin 11 fixes the optical semiconductor elements and the space between the optical semiconductor elements and the flexible printed circuit board 2 is filled therewith to protect the connecting part. Notably, since the signal light propagates in the sealing resin 11, it is preferable to use a resin high in transparency (that is, less absorptive to the signal light) as the sealing resin 11. Moreover, when the through holes for allowing the signal light to pass through are provided in the flexible printed circuit board 2, the through holes are filled with the sealing resin 11 such that voids do not arise.

In the process, the optical path converting mirrors 7 and 8 coated with metal films may be embedded with the sealing resin 10. Not in consideration of transparency, a resin different from sealing resin 11 may be used as the sealing resin 10.

According to the above-mentioned processes, the opto-electric hybrid flexible printed circuit board 1 illustrated in FIG. 1E is obtained.

As above, the width of the input end of the core 3b (W1=80 μm) is sufficiently large compared with the dimension of the light-emitting part 4a of the surface light-emitting element 4 (+30 μm). Furthermore, the ultrasonic wave traveling in the width direction of the core 3b (short-axis direction) is applied to the surface light-emitting element 4 such that the position displacement of the surface light-emitting element 4 due to the ultrasonic bonding arises in the width direction of the core 3b (oscillation direction of the ultrasonic wave). By doing so, even when the output of the ultrasonic wave is raised for securing the strength of bonding, the surface light-emitting element 4 can be mounted at an excellent mounting position, that is, a position where the outside of the optical path converting mirror 7 is not irradiated with the signal light emitted from the surface light-emitting element 4. In this way, even when the output of the ultrasonic wave is raised and this causes displacement in mounting position (for example, ±10 to ±15 μm), the irradiation with the signal light emitted from the surface light-emitting element 4 is performed within a range of the optical path converting mirror 7.

Moreover, the width of the output end of the core 3b (W2=30 μm) is sufficiently small compared with the dimension of the light-receiving part 5a of the surface light-receiving element 5 (φ80 μm). Furthermore, the ultrasonic wave traveling in the width direction of the core 3b (short-axis direction) is applied to the surface light-receiving element 5 such that the position displacement of the surface light-receiving element 5 due to the ultrasonic bonding arises in the width direction of the core 3b (oscillation direction of the ultrasonic wave). Accordingly, even when the output of the ultrasonic wave is raised for securing the strength of bonding, the surface light-receiving element 5 can be mounted at an excellent mounting position, that is, a position where the outside of the light-receiving part 5a is not irradiated with the signal light reflected on the optical path converting mirror 8. In this way, even when the output of the ultrasonic wave is raised and this causes displacement in mounting position (for example, ±10 to ±15 μm), the signal light reflected on the optical path converting mirror 8 is incident on the light-receiving part 5a within a range of the same.

According to the embodiment, the strength of bonding between the optical semiconductor elements (surface light-emitting element 4; surface light-receiving element 5) and the flexible printed circuit board 2 can be made compatible with the precision of the mounting positions of the optical semiconductor elements. As a result, the implementing process of the optical semiconductor elements can be readily allowed to be stable and the yield of the opto-electric hybrid flexible printed circuit boards can be improved.

Second Embodiment

Next, a manufacturing method of the opto-electric hybrid flexible printed circuit board according to a second embodiment is described. One of the differences between the second embodiment and the first embodiment is the presence or absence of the adhesive sheet 6. Hereafter, using FIG. 2A to FIG. 2D, parts different from the first embodiment are primarily described.

Figure 2A:
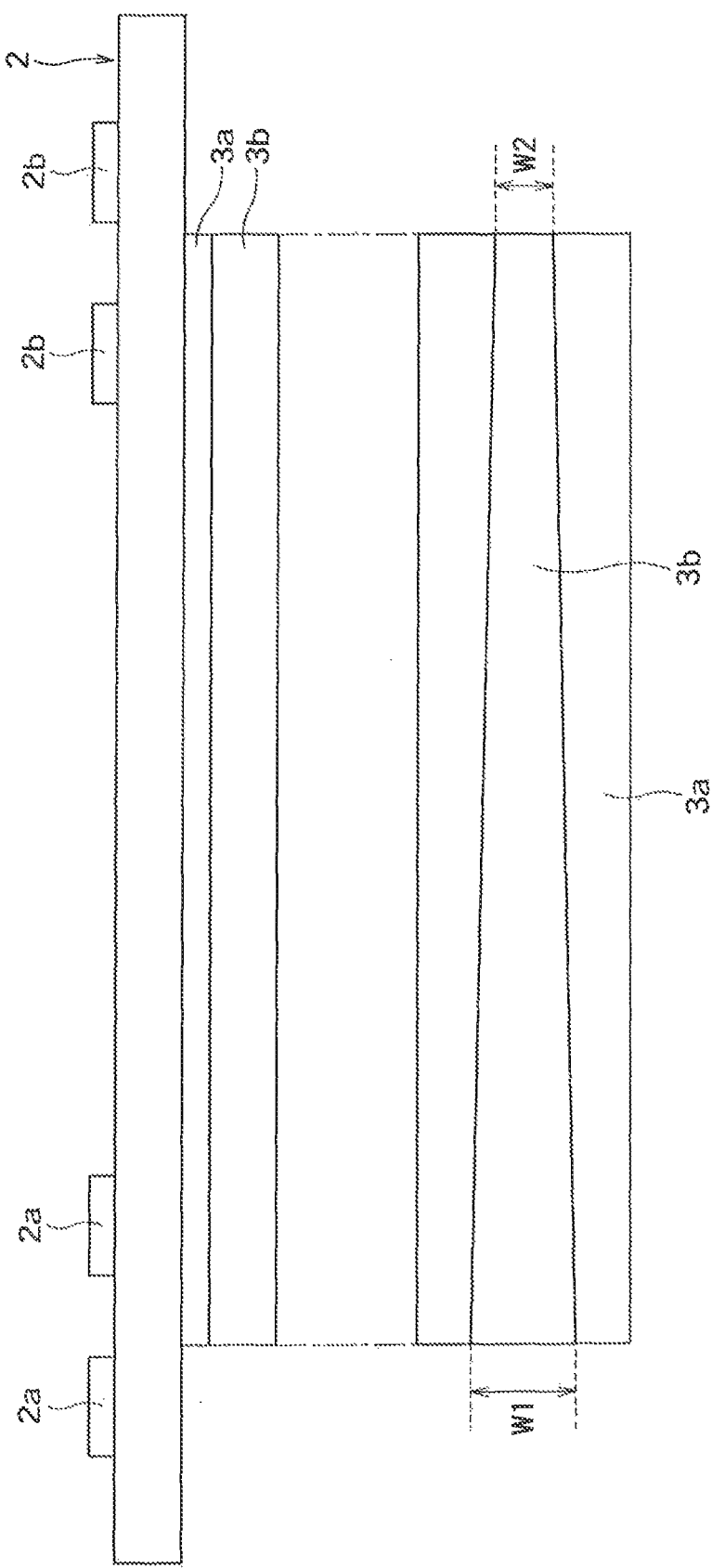
FIG. 2A is an explanatory diagram for a manufacturing method of the opto-electric hybrid flexible printed circuit board according to the second embodiment of the present invention.
Figure 2C:
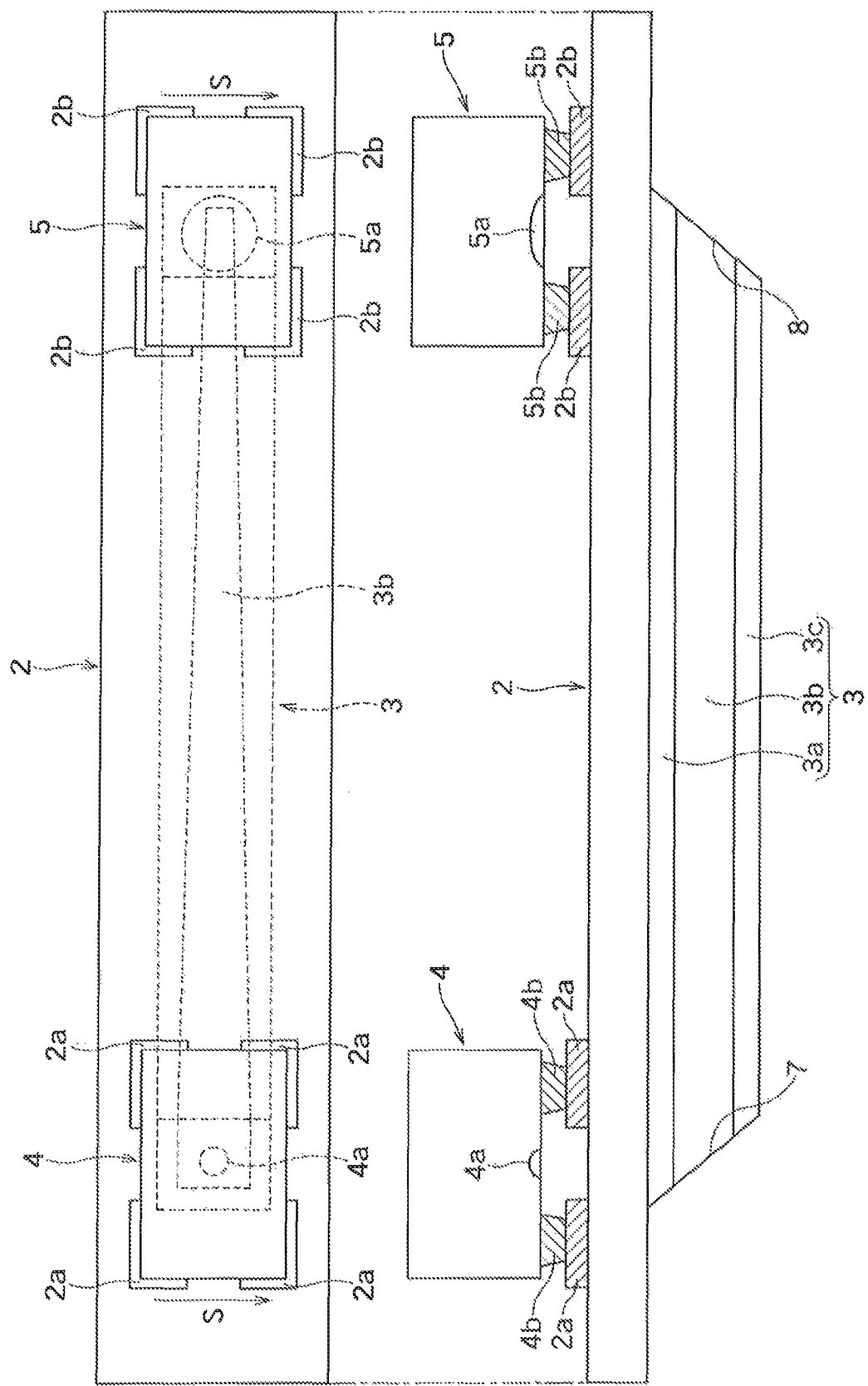
FIG. 2C is an explanatory diagram for a manufacturing method of the opto-electric hybrid flexible printed circuit board according to the second embodiment of the present invention succeedingly to FIG. 2B.
Figure 2D:
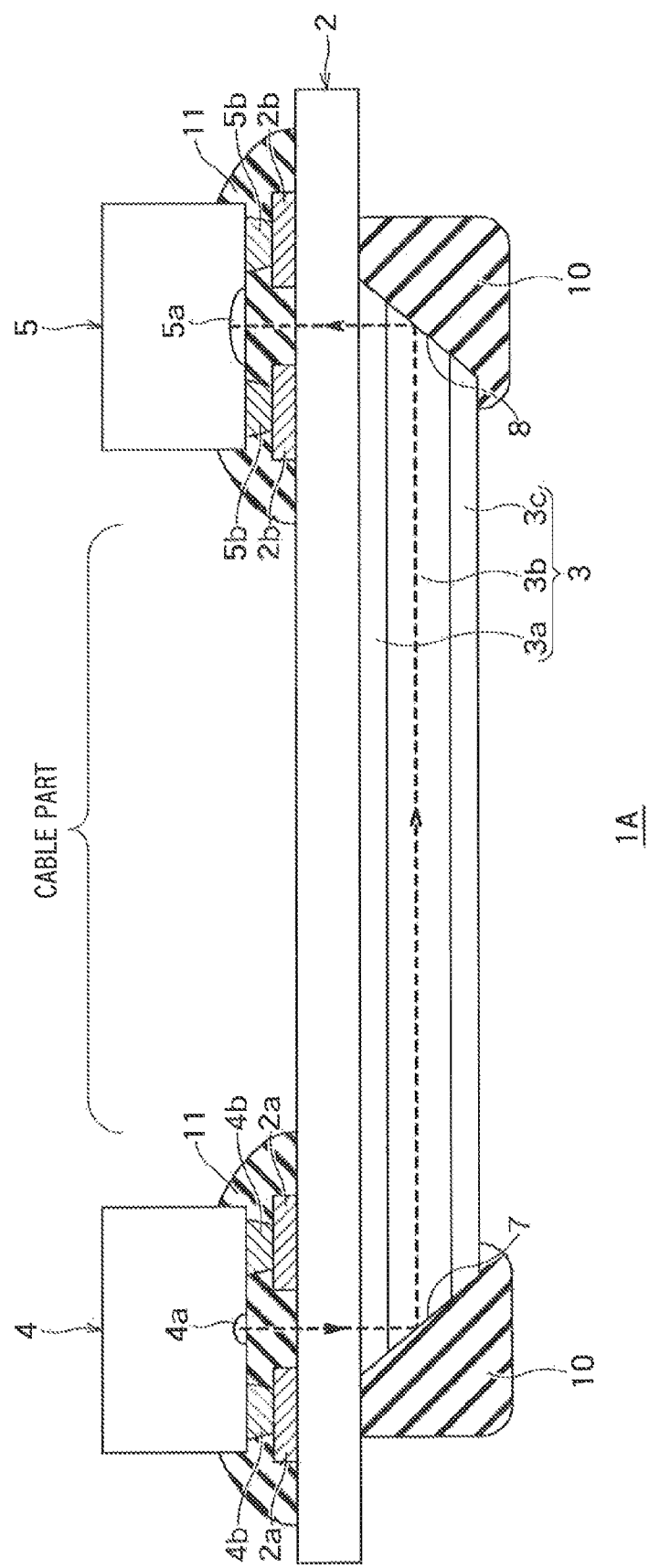
FIG. 2D is a cross-sectional view illustrating a schematic configuration of the opto-electric hybrid flexible printed circuit board according to the second embodiment of the present invention.

FIG. 2D illustrates a cross-sectional view of an opto-electric hybrid flexible printed circuit board 1A according to the second embodiment. As illustrated in FIG. 2D, the opto-electric hybrid flexible printed circuit board 1A according to the present embodiment includes: the flexible printed circuit board 2 having flexibility; the flexible optical waveguide 3 having flexibility directly pasted on the lower face (first principal surface) of the flexible printed circuit board 2; and the surface light-emitting element 4 and the surface light-receiving element 5 which are implemented on the upper face (second principal surface) of the flexible printed circuit board 2. The cladding layer 3a has adhesion and the flexible optical waveguide 3 is directly pasted with the flexible printed circuit board 2 not via an adhesive layer. Notably, as illustrated in FIG. 2D, a region interposed between the surface light-emitting element 4 and the surface light-receiving element 5 is a bendable cable part of the opto-electric hybrid flexible printed circuit board 1A.

Next, the manufacturing method of the opto-electric hybrid flexible printed circuit board 1A is described, referring to FIG. 2A to FIG. 2D. The upper drawing of FIG. 2A illustrates a cross-sectional view of the flexible printed circuit board 2, the cladding layer 3a and the core 3b and the lower drawing thereof illustrates a bottom view of the cladding layer 3a and the core 3b. The upper drawing of FIG. 2B illustrates a cross-sectional view of the flexible printed circuit board 2 and the flexible optical waveguide 3 and the lower drawing thereof illustrates a bottom view of the flexible optical waveguide 3. The upper drawing of FIG. 2C is a top view of the flexible printed circuit board 2 on which the surface light-emitting element 4 and the surface light-receiving element 5 are implemented and the lower drawing thereof is a cross-sectional view of the same.

First, as illustrated in FIG. 2A, the cladding layer 3a that has flexibility and adhesion is pasted at a predetermined position on the lower face (first principal surface) of the flexible printed circuit board 2. Notably, after the cladding layer 3a is pasted, the cladding layer 3a may be irradiated with UV light or the like to be varied into one with desired material characteristics.

Next, the core layer having flexibility is pasted with the cladding layer 3a on the flexible printed circuit board 2.

Notably, when the flexible printed circuit board 2 in which through holes are provided on the optical path of the signal light is used, in order that part of the cladding layer and/or the core layer is prevented from coming into the through holes in pressing, planar pressing or the like which readily affords planarity is preferable to be used.

Next, as illustrated in FIG. 2A, the core layer undergoes patterning, and thereby, the core 3b is formed in which the width of the one end thereof is larger than that of the light-emitting part 4a of the surface light-emitting element 4 and the width of the other end thereof is smaller than that of the light-receiving part 5a of the surface light-receiving element 5. The formation of the core 3b is performed similarly to the method described for the first embodiment. Notably, when the core layer is processed using the photofabrication technique, the pads 2a and 2b of the flexible printed circuit board 2 may be formed in this process.

Next, as illustrated in FIG. 2B, the cladding layer 3c having flexibility is pasted with the cladding layer 3a so as to cover the core 3b. As the cladding layer 3c, the same material as that of the cladding layer 3a may be used. Then, the cladding layers 3a and 3c and the core 3b are cured with UV light, heat or the like, and thereby, the flexible optical waveguide 3 pasted with the flexible printed circuit board 2 is produced.

Next, as illustrated in FIG. 2C, the flexible optical waveguide 3 is processed, and thereby, the optical path converting mirror 7 and the optical path converting mirror 8 each of which converts the optical path of the signal light due to light reflection on the end face are formed at the one end and the other end of the core 3b, respectively. The formation of the optical path converting mirrors 7 and 8 is performed similarly to the method described for the first embodiment.

Notably, when the optical path converting mirrors 7 and 8 are to be protected with the sealing resin 10, as described for the first embodiment, the optical path converting mirrors 7 and 8 are coated with the metal films (not shown).

Next, as illustrated in FIG. 2C, similarly to the method described for the first embodiment, the surface light-emitting element 4 and the surface light-receiving element 5 are implemented on the upper face of the flexible printed circuit board 2 using the ultrasonic bonding. After that, as illustrated in FIG. 2D, the surface light-emitting element 4 and the surface light-receiving element 5 are fixed with the sealing resin 11 high in transparency.

According to the above-mentioned processes, the opto-electric hybrid flexible printed circuit board 1A illustrated in FIG. 2D is obtained.

The manufacturing method according to the second embodiment attains a similar effect to that in the first embodiment. Namely, according to the second embodiment, the strength of bonding between the optical semiconductor elements and the flexible printed circuit board 2 can be made compatible with the precision of the mounting positions of the optical semiconductor elements. As a result, the implementing process of the optical semiconductor elements can be easily allowed to be stable and the yield of the opto-electric hybrid flexible printed circuit boards can be improved.

(Modifications of Core Shape)

While the planar shape of the core is a uniform tapered shape in the first and second embodiments, another core shape can be considered. The planar shape of the core only has to have its core width which varies such that the width at the incident end of the signal light is wider than that of the light-emitting part 4a and it is narrower than that of the light-receiving part 5a at the exiting end thereof. Accordingly, the core may adopt one which includes both of a region where the core width continuously varies and a region where the core width is constant as well as the one which has the core width which continuously varies from the incident end to the exiting end.

Modifications of the core shape are described using FIG. 3. Portions (a), (b) and (c) of FIG. 3 are plan views of the cladding layer 3a and the core 3b formed thereon.

In the core illustrated in portion (a) of FIG. 3, the width of the core 3b is constant in regions M and N where the optical path converting mirrors 7 and 8 are formed. Namely, the width of the core 3b in the region M is equal to the width of the left end (one end) and the width of the core 3b in the region N is equal to the width of the right end (another end). Moreover, the width of the core 3b in a propagating region P (length of 100 mm) interposed between the regions M and N monotonously decreases from the optical path converting mirror 7 side (one end) toward the optical path converting mirror 8 side (another end).

When the optical path converting mirrors 7 and 8 are formed to be at 45 degrees with respect to the lower face of the flexible printed circuit board 2, the lengths of the regions M and N are equal to the thickness of the core 3b. In the modification in portion (a) of FIG. 3, since the thickness of the core 3b is 50 μm, the lengths of the regions M and N are also 50 μm. The same holds true for portions (b) and (c) of FIG. 3. The core width in the regions M and N is constant, and thereby, margins against the mounting position displacement of the optical semiconductor elements can be readily secured.

Next, the core illustrated in portion (b) of FIG. 3 has three propagating regions (A, B and C). Lengths of the propagating regions A, B and C are 10 mm, 80 mm and 10 mm, respectively. The propagating region A is a region interposed between the region M where the optical path converting mirror 7 is formed and the propagating region B. The propagating region C is a region interposed between the propagating region B and the region N where the optical path converting mirror 8 is formed.

As illustrated in portion (b) of FIG. 3, the width of the core 3b monotonously decreases from the optical path converting mirror 7 side (one end) toward the optical path converting mirror 8 side (another end) in the propagating region A, is constant in the propagating region B, and is equal to that in the propagating region B or monotonously decreases from the optical path converting mirror 7 side (one end) toward the optical path converting mirror 8 side (another end) in the propagating region C.

Specifically, the core width decreases from 60 to 80 μm to 50 μm in the propagating region A, is maintained to be 50 μm in the propagating region B, and decreases from 50 μm to 30 μm, at most, in the propagating region C. Notably, the core width in the propagating region C may be maintained to be the same value as the width in the propagating region B. Moreover, the planar shape of the propagating region B is not limited to a straight shape but may be a curve such as an S shape. The thickness of the core is same as in any of the propagating regions and is, for example, 50 μm to 80 μm.

Next, the core illustrated in portion (c) of FIG. 3 has the three propagating regions (A, B and C). The lengths of the propagating regions A, B and C are 10 mm, 80 mm and 10 mm, respectively. The propagating region A is a region interposed between the region M where the optical path converting mirror 7 is formed and the propagating region B. The propagating region C is a region interposed between the propagating region B and the region N where the optical path converting mirror 8 is formed.

As illustrated in portion (c) of FIG. 3, the width of the core 3b is constant in the propagating regions A and C, and monotonously decreases from the optical path converting mirror 7 side (one end) toward the optical path converting mirror 8 side (another end) in the propagating region B. Specifically, the core width is constant in the propagating region A, decreases from 60 to 80 μm to 30 to 50 μm in the propagating region B, and is constant in the propagating region C. The thickness of the core is same as in any of the propagating regions and is, for example, 50 μm to 80 μm.

Next, results obtained by simulating decrease rates of power of the signal light for the three kinds of cores illustrated in portions (a) to (c) of FIG. 3 are described. Portions (a) to (c) of FIG. 4 illustrate decrease rates of the signal light power compared with that in the case where the core width is constant (50 μm) over the whole length of the propagating region for the cores in portions (a) to (c) of FIG. 3, respectively. Notably, "incident side" and "exiting side" in the tables denote the core widths at the incident end and the exiting end of each propagating region, respectively. Moreover, "power (mW)" denotes the power of the signal light exiting out of the core.

As apparent from portions (a) to (c) of FIG. 4, for any of the three kinds of cores above, the decrease rate of the signal light power falls on or below 5%. The decrease rate of 5% corresponds to an increase in transmission loss by approximately 0.1 dB. Meanwhile, the decrease rate of the signal light power due to displacement in mounting position of the optical semiconductor element is approximately 20%. This decrease rate corresponds to an increase in transmission loss by approximately 0.8 dB. As above, the increase in transmission loss due to variation of the core width is much smaller than the increase due to displacement in mounting position of the optical semiconductor element. Varying the core width enables a margin for the precision of the mounting position of the optical semiconductor element to be increased. Thus, according to the present invention, the strength of bonding can be made compatible with the precision of the mounting position.

While, based on the above description, one skilled in the art may be able to envision various modifications and additional effects of the present invention, embodiments of the present invention is not intended to be limited to the embodiments described above. The constituents over the different embodiments may be properly combined. Additions, modifications and partial elimination are possible in a variety of ways without departing from the scope and spirit of the invention derived from the contents as defined in the appended claims and their equivalents.

REFERENCE SIGNS LIST 1 and 1A Opto-electric hybrid flexible printed circuit board
2 Flexible printed circuit board
2a and 2b Pads
3 Flexible optical waveguide
3a and 3c Cladding layers
3b Core
4 Surface light-emitting element
4a Light-emitting part
4b Electrode
5 Surface light-receiving element
5a Light-receiving part
5b Electrode
6 Adhesive sheet
7 and 8 Optical path converting mirrors
10 and 11 Sealing resins
A, B, C and P Propagating regions
M and N Optical path converting mirror forming regions
S Ultrasonic wave application direction

The invention claimed is:

1. A manufacturing method of an opto-electric hybrid flexible printed circuit board, the opto-electric hybrid flexible printed circuit board including a flexible printed circuit board having a first principal surface and a second principal surface on an opposite side to the first principal surface; a flexible optical waveguide provided along the first principal surface of the flexible printed circuit board and made of organic polymer; and a surface light-emitting element and a surface light-receiving element both of which are implemented on the second principal surface of the flexible printed circuit board, the method comprising:

a step of pasting a first flexible cladding layer with a flexible core layer;

a step of forming a core, by patterning the flexible core layer, such that a width of one end of the core is larger than that of a light-emitting part of the surface light-emitting element and that a width of other end of the core is smaller than that of a light-receiving part of the surface light-receiving element;

a step of producing the flexible optical waveguide by pasting a second flexible cladding layer on the first cladding layer so as to cover the core;

a step of pasting the flexible optical waveguide at a predetermined position on the first principal surface of the flexible printed circuit board via an adhesive sheet;

a mirror forming step of respectively forming, at the one end and the other end of the core, a first optical path converting mirror and a second optical path converting mirror each of which converts an optical path of signal light due to light reflection on an end face by processing the flexible optical waveguide pasted with the flexible printed circuit board;

a first ultrasonic bonding step, performed after the mirror forming step, of implementing the surface light-emitting element on the flexible printed circuit board such that the signal light emitted from the light-emitting part of the surface light-emitting element is reflected by the first optical path converting mirror and propagates in the core; and a second ultrasonic bonding step, performed after the mirror forming step, of implementing the surface light-receiving element on the flexible printed circuit board such that the signal light reflected by the second optical path converting mirror is incident on the light-receiving part of the surface light-receiving element, wherein in the first ultrasonic bonding step, an ultrasonic wave traveling along a width direction of the core is applied to the surface light-emitting element while pressure in a thickness direction is exerted on the surface light-emitting element placed at a predetermined position on the flexible printed circuit board, thereby electrically connecting a first electrode of the surface light-emitting element, which is provided on the same face as that of the light-emitting part, to a first pad provided on the second principal surface of the flexible printed circuit board, in the second ultrasonic bonding step, the ultrasonic wave traveling along the width direction of the core is applied to the surface light-receiving element while the pressure in the thickness direction is exerted on the surface light-receiving element placed at a predetermined position on the flexible printed circuit board, thereby electrically connecting a second electrode of the surface light-receiving element, which is provided on the same face as that of the light-receiving part, to a second pad provided on the second principal surface of the flexible printed circuit board.

2. The manufacturing method of the opto-electric hybrid flexible printed circuit board according to claim 1, wherein
the width of the one end of the core is larger than a value obtained by adding a position displacement amount of the surface light-emitting element in the width direction, which arises in the first ultrasonic bonding, to a diameter of the signal light in the width direction with which the first optical path converting mirror is irradiated, and
the width of the other end of the core is larger than a value obtained by adding a position displacement amount of the surface light-receiving element in the width direction, which arises in the second ultrasonic bonding, to a diameter of the signal light in the width direction with which the second optical path converting mirror is irradiated.

3. The manufacturing method of the opto-electric hybrid flexible printed circuit board according to claim 1, wherein
at least in a propagating region interposed between regions where the first optical path converting mirror and the second optical path converting mirror are formed, the width of the core monotonously decreases from the one end toward the other end.

4. The manufacturing method of the opto-electric hybrid flexible printed circuit board according to claim 1, wherein
the core includes a first propagating region; a second propagating region interposed between a region where the first optical path converting mirror is formed and the first propagating region; and a third propagating region interposed between the first propagating region and a region where the second optical path converting mirror is formed, and
the width of the core monotonously decreases from the one end toward the other end in the second propagating region, is constant in the first propagating region, and is maintained to be the same width as that in the first propagating region or monotonously decreases from the one end toward the other end in the third propagating region.

5. The manufacturing method of the opto-electric hybrid flexible printed circuit board according to claim 1, wherein
the core includes a first propagating region; a second propagating region interposed between a region where the first optical path converting mirror is formed and the first propagating region; and a third propagating region interposed between the first propagating region and a region where the second optical path converting mirror is formed, and
the width of the core is constant in the second and third propagating regions, and monotonously decreases from the one end toward the other end in the first propagating region.

6. The manufacturing method of the opto-electric hybrid flexible printed circuit board according to claim 1, wherein
the width of the core in a region where the first optical path converting mirror is formed is equal to the width of the one end, and
the width of the core in a region where the second optical path converting mirror is formed is equal to the width of the other end.

7. The manufacturing method of the opto-electric hybrid flexible printed circuit board according to claim 1, wherein
the first and second optical path converting mirrors are coated with a metal film.

8. The manufacturing method of the opto-electric hybrid flexible printed circuit board according to claim 7, wherein
after the metal film is formed, the first and second optical path converting mirrors are embedded with a sealing resin.

9. A manufacturing method of an opto-electric hybrid flexible printed circuit board, the opto-electric hybrid flexible printed circuit board including a flexible printed circuit board having a first principal surface and a second principal surface on an opposite side to the first principal surface; a flexible optical waveguide provided along the first principal surface of the flexible printed circuit board and made of organic polymer; and a surface light-emitting element and a surface light-receiving element both of which are implemented on the second principal surface of the flexible printed circuit board, the method comprising:

a step of pasting a first flexible and adhesive cladding layer at a predetermined position on the first principal surface of the flexible printed circuit board;

a step of pasting a flexible core layer with the first cladding layer on the flexible printed circuit board;

a step of forming a core, by patterning the flexible core layer, such that a width of one end of the core is larger than that of a light-emitting part of the surface light-emitting element and that a width of other end of the core is smaller than that of a light-receiving part of the surface light-receiving element;

a step of producing the flexible optical waveguide by pasting a second flexible cladding layer on the first cladding layer so as to cover the core;

a mirror forming step of respectively forming, at the one end and the other end of the core, a first optical path converting mirror and a second optical path converting mirror each of which converts an optical path of signal light due to light reflection on an end face by processing the flexible optical waveguide;

a first ultrasonic bonding step, performed after the mirror forming step, of implementing the surface light-emitting element on the flexible printed circuit board such that the signal light emitted from the light-emitting part of the surface light-emitting element is reflected by the first optical path converting mirror and propagates in the core; and a second ultrasonic bonding step, performed after the mirror forming step, of implementing the surface light-receiving element on the flexible printed circuit board such that the signal light reflected by the second optical path converting mirror is incident on the light-receiving part of the surface light-receiving element, wherein in the first ultrasonic bonding step, an ultrasonic wave traveling along a width direction of the core is applied to the surface light-emitting element while pressure in a thickness direction is exerted on the surface light-emitting element placed at a predetermined position on the flexible printed circuit board, thereby electrically connecting a first electrode of the surface light-emitting element, which is provided on the same face as that of the light-emitting part, to a first pad provided on the second principal surface of the flexible printed circuit board, in the second ultrasonic bonding step, the ultrasonic wave traveling along the width direction of the core is applied to the surface light-receiving element while the pressure in the thickness direction is exerted on the surface light-receiving element placed at a predetermined position on the flexible printed circuit board, thereby electrically connecting a second electrode of the surface light-receiving element, which is provided on the same face as that of the light-receiving part, to a second pad provided on the second principal surface of the flexible printed circuit board.

10. The manufacturing method of the opto-electric hybrid flexible printed circuit board according to claim 9, wherein
the width of the one end of the core is larger than a value obtained by adding a position displacement amount of the surface light-emitting element in the width direction, which arises in the first ultrasonic bonding, to a diameter of the signal light in the width direction with which the first optical path converting mirror is irradiated, and
the width of the other end of the core is larger than a value obtained by adding a position displacement amount, of the surface light-receiving element in the width direction, which arises in the second ultrasonic bonding to a diameter of the signal light in the width direction with which the second optical path converting mirror is irradiated.

11. The manufacturing method of the opto-electric hybrid flexible printed circuit board according to claim 9, wherein
at least in a propagating region interposed between regions where the first optical path converting mirror and the second optical path converting mirror are formed, the width of the core monotonously decreases from the one end toward the other end.

12. The manufacturing method of the opto-electric hybrid flexible printed circuit board according to claim 9, wherein
the core includes a first propagating region; a second propagating region interposed between a region where the first optical path converting mirror is formed and the first propagating region; and a third propagating region interposed between the first propagating region and a region where the second optical path converting mirror is formed, and
the width of the core monotonously decreases from the one end toward the other end in the second propagating region, is constant in the first propagating region, and is maintained to be the same width as that in the first propagating region or monotonously decreases from the one end toward the other end in the third propagating region.

13. The manufacturing method of the opto-electric hybrid flexible printed circuit board according to claim 9, wherein
the core includes a first propagating region; a second propagating region interposed between a region where the first optical path converting mirror is formed and the first propagating region; and a third propagating region interposed between the first propagating region and a region where the second optical path converting mirror is formed, and
the width of the core is constant in the second and third propagating regions, and monotonously decreases from the one end toward the other end in the first propagating region.

14. The manufacturing method of the opto-electric hybrid flexible printed circuit board according to claim 9, wherein
the width of the core in a region where the first optical path converting mirror is formed is equal to the width of the one end, and
the width of the core in a region where the second optical path converting mirror is formed is equal to the width of the other end.

15. The manufacturing method of the opto-electric hybrid flexible printed circuit board according to claim 9, wherein
the first and second optical path converting mirrors are coated with a metal film.

16. The manufacturing method of the opto-electric hybrid flexible printed circuit board according to claim 15, wherein
after the metal film is formed, the first and second optical path converting mirrors are covered with a sealing resin.

17. The manufacturing method of the opto-electric hybrid flexible printed circuit board according to claim 1, wherein
the width of the one end of the core is larger than a value obtained by adding a position displacement amount of the surface light-emitting element in the width direction, which arises in the first ultrasonic bonding, to a diameter of the signal light in the width direction with which the first optical path converting mirror is irradiated, and
the width of the other end of the core is smaller than a value obtained by subtracting a position displacement amount of the surface light-receiving element in the width direction, which arises in the second ultrasonic bonding, from a dimension of the light-receiving part of the surface light-receiving element.

18. The manufacturing method of the opto-electric hybrid flexible printed circuit board according to claim 9, wherein
the width of the one end of the core is larger than a value obtained by adding a position displacement amount of the surface light-emitting element in the width direction, which arises in the first ultrasonic bonding, to a diameter of the signal light in the width direction with which the first optical path converting mirror is irradiated, and
the width of the other end of the core is smaller than a value obtained by subtracting a position displacement amount of the surface light-receiving element in the width direction, which arises in the second ultrasonic bonding, from a dimension of the light-receiving part of the surface light-receiving element.

* * * * *